United States Patent
Kobayashi

(10) Patent No.: US 6,243,570 B1
(45) Date of Patent: Jun. 5, 2001

(54) RADIO RECEIVER CAPABLE OF TEMPERATURE ADJUSTMENT TO TUNING FREQUENCY OF RF TUNING CIRCUIT

(75) Inventor: Keiji Kobayashi, Gunma-ken (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 09/047,419

(22) Filed: Mar. 25, 1998

(30) Foreign Application Priority Data

Mar. 28, 1997 (JP) .................................................. 9-078315

(51) Int. Cl.⁷ ...................................................... H04B 1/16
(52) U.S. Cl. .................... 455/340; 455/184.1; 455/193.3
(58) Field of Search ................................ 455/340, 180.4, 455/182.1, 264, 179.1, 182.2, 182.3, 184.1, 192.1, 192.2, 192.3, 290, 286, 283, 193.1, 193.2, 193.3

(56) References Cited

U.S. PATENT DOCUMENTS

| | | | |
|---|---|---|---|
| 3,697,885 | * | 10/1972 | Avins et al. ........................ 331/36 C |
| 4,528,698 | * | 7/1985 | Fraser ................................... 455/340 |
| 4,921,467 | * | 5/1990 | Lax ....................................... 455/264 |
| 5,428,829 | * | 6/1995 | Osburn et al. ..................... 455/197.1 |
| 5,634,205 | * | 5/1997 | Kurisu et al. ...................... 455/182.1 |
| 5,740,525 | * | 4/1998 | Spears ................................. 455/259 |
| 5,774,800 | * | 6/1998 | Mori ..................................... 455/255 |
| 5,991,609 | * | 11/1999 | Marrah et al. .................... 455/182.2 |

* cited by examiner

*Primary Examiner*—William G. Trost
*Assistant Examiner*—Tilahun Gesesse
(74) *Attorney, Agent, or Firm*—Cantor Colburn LLP

(57) ABSTRACT

A variation in tuning frequency of an RF tuning circuit due to temperature changes in a radio receiver is prevented. A tuning frequency of an RF tuning circuit results from a coil (L) and a varicap diode that constitute the RF tuning circuit. A capacitance of the diode is corrected on the basis of a received frequency of a desired station and characteristics of the diode so that the tuning frequency matches the desired station. Thereafter, a temperature is detected by a temperature detection circuit. If a detected temperature T is within 0° C. to 50° C., the tuning frequency of the RF tuning circuit is maintained without change. If the detected temperature T is below 0° C. or higher than 50° C., the tuning frequency is fine adjusted to become lower or higher, respectively.

12 Claims, 6 Drawing Sheets

RADIO RECEIVER CAPABLE OF TEMPERATURE ADJUSTMENT TO TUNING FREQUENCY OF RF TUNING CIRCUIT

BACKGROUND OF THE INVENTION

1. Field of the Invention

The present invention relates to a radio receiver that corrects a tuning frequency of an RF tuning circuit on the basis of a frequency of a desired station and characteristics of a tuning element in the RF tuning circuit.

2. Description of the Related Art

Radio receivers normally include a means for preventing tracking error, which is the deviation between a tuning frequency of an RF tuning circuit and a frequency of an RF signal to be converted to a desired IF signal at a mixer circuit. A means has been proposed for correcting the RF tuning frequency in such radio receivers while taking into consideration the characteristics of a varicap diode as well as a coil constituting the RF tuning circuit. Such a radio receiver may be configured as shown in FIG. 1, and the tuning frequency of the RF tuning circuit is corrected according to the flowchart of FIG. 2.

In FIG. 1, the received RF signal is amplified by an RF amplifier 1, then tuned by an RF tuning circuit 2. The tuned RF signal is converted in frequency at a mixer 3 with a local oscillation signal from a local oscillator 4 to an IF signal having, for example, a center frequency of 10.7 MHz. The IF signal is amplified by an IF amplifier 5, then searched for FM at an FM detector 6.

An operation to set the tuning frequency of the RF tuning circuit 2 will be described next with reference to the flowchart of FIG. 2. First, the frequency of a local oscillation signal is set by a local oscillation control signal "a" of a controller 7. The frequency of the local oscillation signal is set so that the IF signal corresponding to the frequency of an RF signal for a desired station becomes 10.7 MHz. To accomplish this, the received frequency of the desired station is calculated at the controller 7 on the basis of the local oscillation control signal "a" (Si). On the other hand, a memory 8 stores characteristics of a diode 2a. The tuning frequency of the RF tuning circuit 2 is determined by a coil L and the varicap diode 2a. Since the coil L is fixed, the tuning frequency varies according to the capacitance of the diode 2a. Furthermore, since the capacitance of the diode 2a changes with a tuning correction signal "b", the tuning frequency changes according to the tuning correction signal "b". As a result, the tuning correction signal "b" increases as the tuning frequency rises as shown by a broken line in FIG. 3. The memory 8 stores characteristic resulting data which is discrete and has narrower data intervals as the frequency rises, as shown by the circles in FIG. 3. Since the received frequency of the desired station calculated in step S1 is to become the tuning frequency, the controller 7 determines which region of the tuning frequency contains the received frequency of the desired station (S2). For example, if the received frequency of the desired station is between the tuning frequencies of A and B, a formula for a straight line connecting the corresponding data A and B is determined (S3), and the tuning correction signal "b" for the desired station is calculated by substituting the received frequency of the desired station into the straight line formula (S4). If the received frequency is not between A and B, a straight line formula is determined from data of both ends of that region (S5). The calculated tuning correction signal "b" is impressed onto the diode 2a, the capacitance of the diode 2a is set, and the tuning frequency of the RF tuning circuit 2 is tuned to the frequency of the desired station (S6). In this manner, the tuning frequency of the RF tuning circuit 2 matches the frequency of the desired station so that tracking error is prevented.

However, the coil L and the varicap diode 2a have positive temperature characteristics. Thus, as the temperature changes within the radio receiver, the capacitance of the diode 2a changes. Since the tuning frequency of the RF tuning circuit 2 is corrected by the fixed tuning correction signal "b", the tuning frequency of the RF tuning circuit 2 changes from the change in temperature.

SUMMARY OF THE INVENTION

In known radio receivers, when the temperature in the radio receiver changes due to heat dissipation of the radio receiver or to a change in the outside air temperature, a problem occurs where the tuning frequency deviates from the frequency of the desired station to result in tracking error, even if the RF tuning frequency is corrected beforehand to the received frequency of the desired station. It is an object of the present invention to solve this problem.

The present invention comprises, in a radio receiver having an RF tuning circuit for tuning an RF signal and a correction circuit for generating a correction signal to correct a tuning frequency of the RF tuning circuit so as to match a frequency of a desired station, a temperature detecting means for detecting a temperature of the radio receiver and an adjusting means for fine adjusting the correction signal in accordance with the temperature.

The adjusting means has a first reference temperature and a second reference temperature, which is higher than the first reference temperature, and is characterized by fine adjusting the above-mentioned correction signal only by a first predetermined amount when the above-mentioned temperature is lower than the first reference temperature, by fine adjusting the above-mentioned correction signal by only a second predetermined amount when the above-mentioned temperature is higher than the second reference temperature, and by not fine adjusting the above-mentioned correction signal when the above-mentioned temperature is higher than or equal to the first reference temperature and lower than or equal to the second reference temperature.

Furthermore, the adjusting means is characterized by slowing the fine adjustment speed when fine adjusting the correction signal.

Still further, the adjusting means is characterized by determining which of a plurality of regions contains the detected temperature, and by correcting the above-mentioned correction signal by an adjustment amount that has been set to match the determined region.

According to the present invention, by fine adjusting the correction signal in accordance with the radio receiver's temperature that is detected by the temperature detecting means and fine adjusting the tuning frequency of the RF tuning circuit, the tuning frequency is fine adjusted so as not to deviate from the received frequency of the desired station due to temperature changes.

DETAILED DESCRIPTION OF THE PREFERRED EMBODIMENTS

Figure 1:
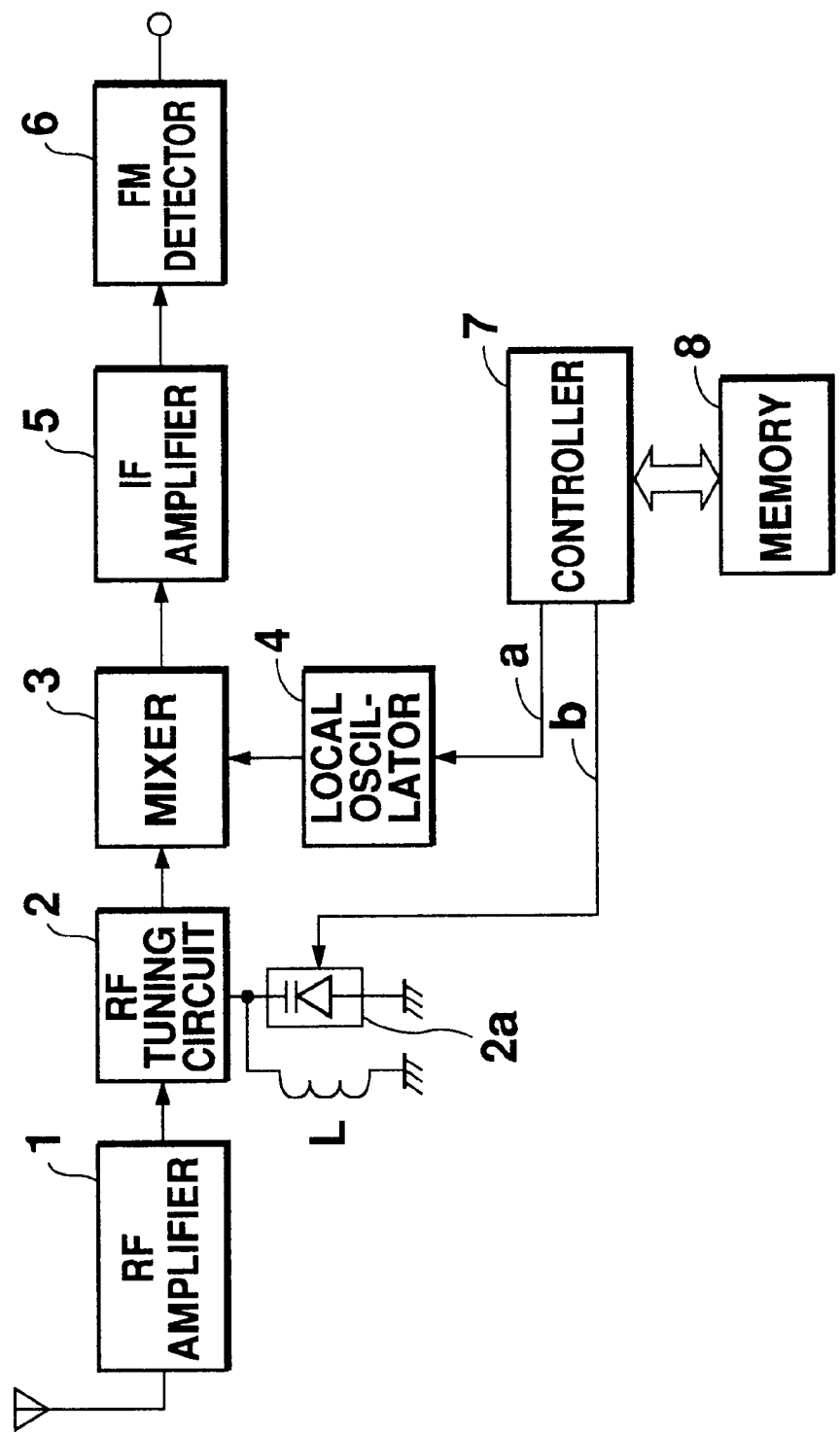
FIG. 1 is a block diagram showing an example of a known radio receiver.
Figure 2:
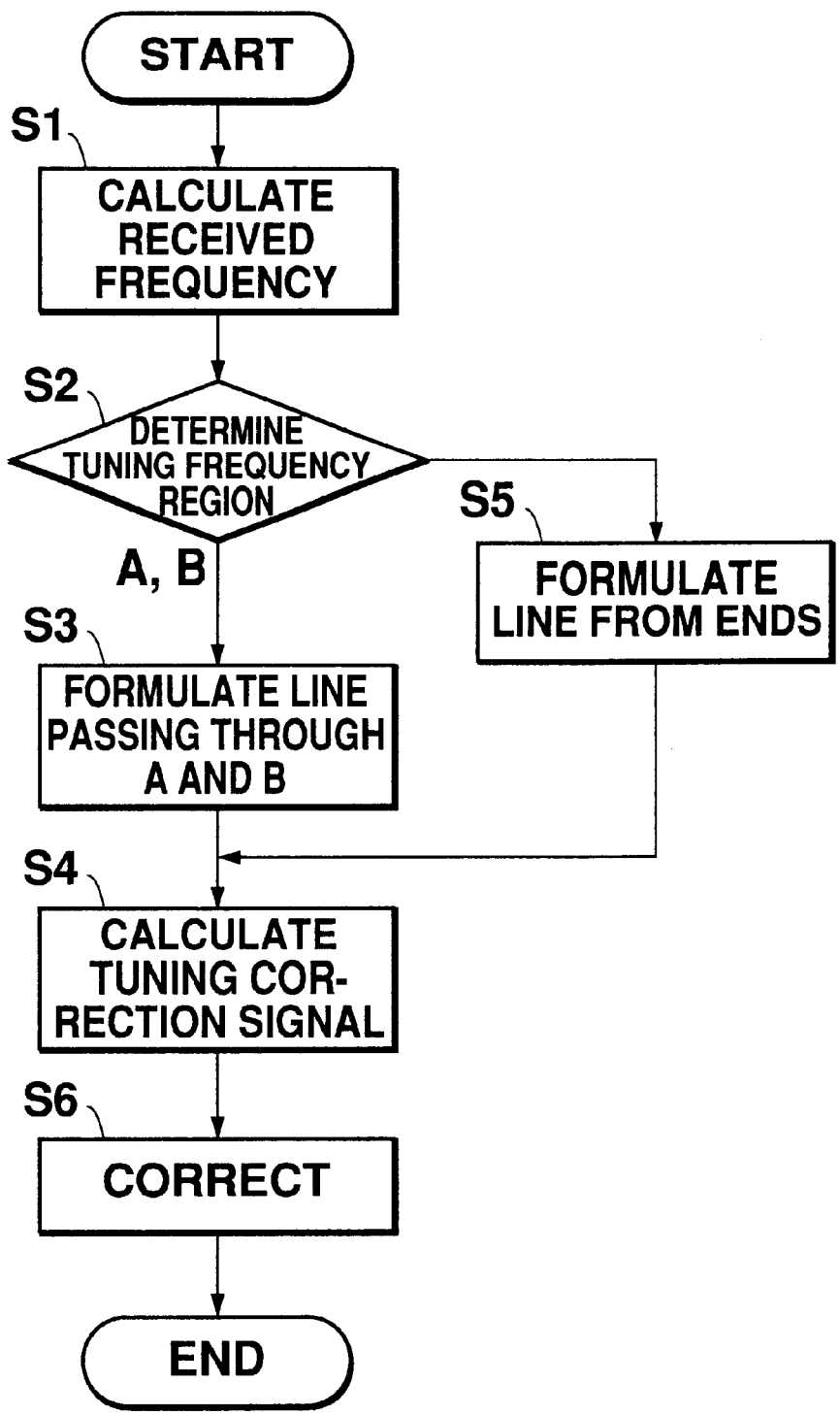
FIG. 2 is a flowchart showing a circuit operation for FIG. 1.
Figure 4:
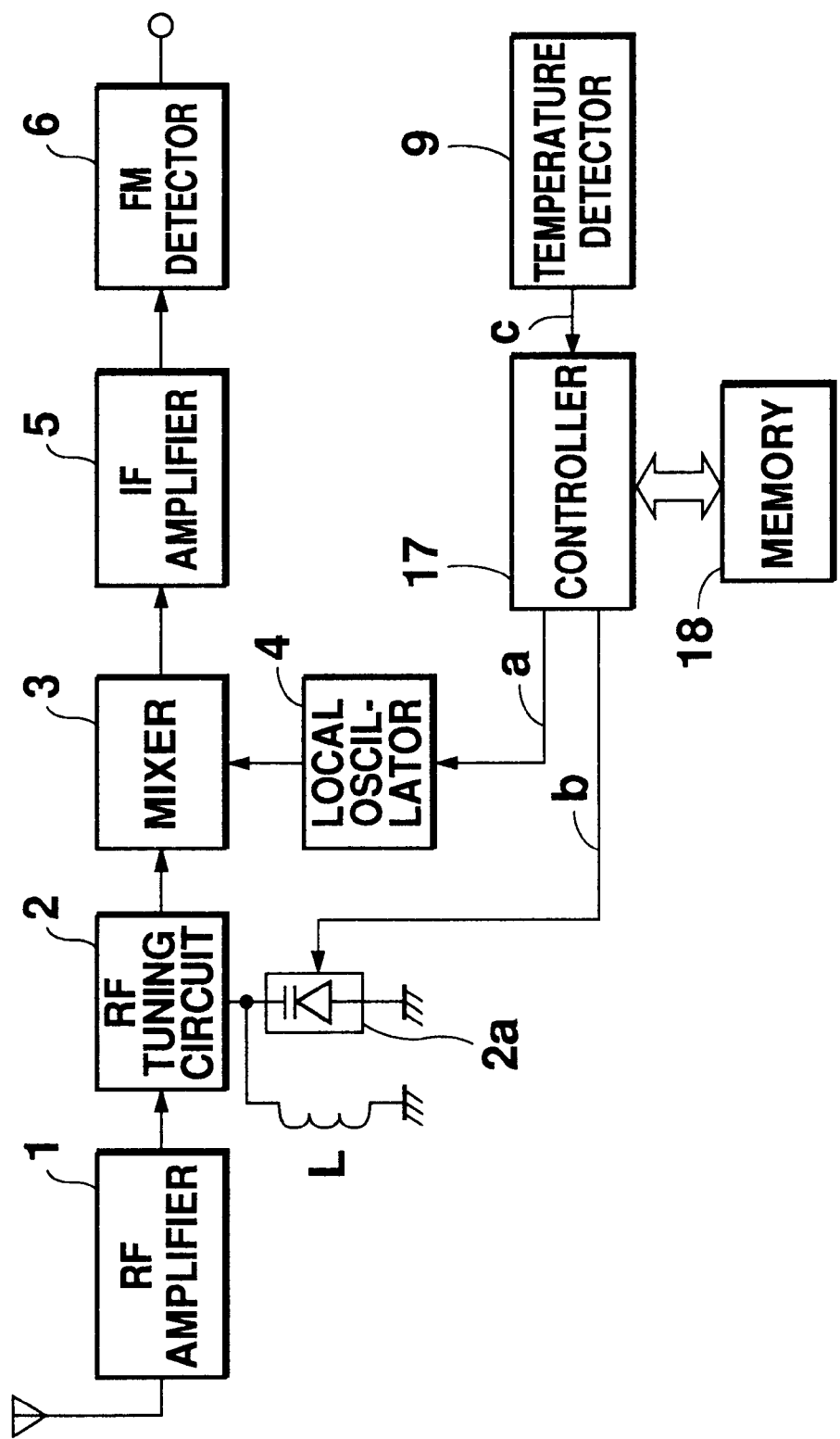
FIG. 4 is a block diagram showing a preferred embodiment of the present invention.

FIG. 4 shows the preferred embodiment of the present invention, in which a difference in configuration with the example of FIG. 1 is the addition of a temperature detector 9 which detects the temperature of the radio receiver and outputs a detected result to a controller 17.

Figure 3:
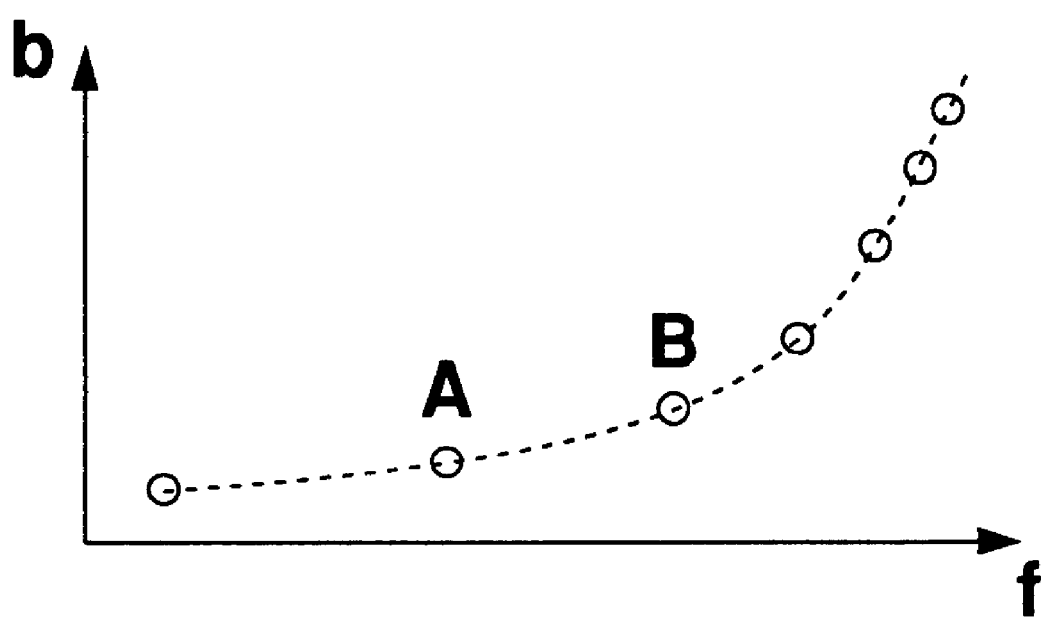
FIG. 3 illustrates a relationship between a strength of tuning correction signal "b" and tuning frequency "f" for characteristic data stored in memory.

A circuit operation for the block diagram in FIG. 4 will be described next with reference to the flowchart in FIG. 5. First, optimum reception of a desired station is performed in a conventional manner. Namely, the local oscillation control signal "a" corresponding to the received frequency of the desired station is impressed onto the local oscillator 4, and the local oscillation frequency is set so that the RF signal of the desired station is converted in frequency to an IF signal, such as of 10.7 MHz. The tuning correction signal "b" corresponding to the desired station is calculated from the frequency of the desired station that is determined from the local oscillation control signal "a" and a relationship stored in a memory 18 between the received frequency and the tuning correction signal "b" as shown in FIG. 3. The tuning frequency of the RF tuning circuit 2 is corrected in accordance with the calculated tuning correction signal "b" so that the tuning frequency matches the received frequency of the desired station (S21). Next, a temperature T of the radio receiver is detected at the temperature detector 9, and a detection signal "c" corresponding to temperature T is impressed onto the controller 17 (S22). At the controller 17, it is determined whether the detected temperature T is below 0° C., within 0° C. to 50° C., or above 50° C. (S23).

If the detected temperature T is below 0° C., the inductance of coil L and the capacitance of diode 2a decrease due to positive temperature characteristics so that the tuning frequency of the RF tuning circuit 2 rises above the received frequency of the desired station. The controller 17 then fine adjusts the tuning correction signal "b" to a smaller value so as to lower the tuning frequency of the RF tuning circuit 2 so that the tuning frequency is fine adjusted to match the desired frequency. As a result, tracking error due to temperature changes can be reduced. More specifically, the tuning correction signal "b" is obtained by creating, for example, a 6-bit digital signal within the controller 17, and then converting the digital signal to an analog signal within the controller 17. Fine adjustment of the tuning correction signal "b" is performed by adding data "–000100" read from the memory 18 to the tuning correction signal "b" in the state of a digital signal (S24). After fine adjustment is performed, the radio receiver enters a standby state for temperature detection (S26) and reception of the desired station is performed at the fine-adjusted tuning frequency (S25).

If the detected temperature is within 0° C. to 50° C., the tuning frequency of the RF tuning circuit 2 does not substantially deviate from the received frequency of the desired station so as to cause tracking error. The controller 17 does not fine adjust the tuning correction signal "b" and maintains the tuning correction signal "b" obtained in step S1. Thus, a state is maintained in which the tuning frequency of the RF tuning circuit 2 essentially matches the received frequency of the desired station so that the tuning frequency of the RF tuning circuit is essentially equal (S27) to the received frequency of the desired station. Thereafter, the radio receiver enters the standby state for temperature detection (S26) and receives the desired broadcast station (S25).

Furthermore, if the detected temperature is above 50° C., the inductance of coil L and the capacitance of diode 2a increase so that the tuning frequency of the RF tuning circuit 2 drops below the received frequency of the desired station. The controller 17 then fine adjusts the tuning correction signal "b" to a larger value so as to raise the tuning frequency of the RF tuning circuit 2. This fine adjusts the tuning frequency to match the desired frequency. As a result of this fine adjustment, tracking error due to temperature changes can be reduced. More specifically, the tuning correction signal "b" in the state of a digital signal is fine adjusted by adding thereto a data of "+000100" (S28). After fine adjustment is performed, the radio receiver enters the standby state for temperature detection (S26) and reception of the desired station is performed at the fine-adjusted tuning frequency (S25).

When a predetermined time elapses during the standby state of the radio receiver, the operation returns to step S22 and temperature detection of the radio receiver is repeated. Fine adjustment of the tuning frequency of the RF tuning circuit 2 is performed on the basis of the result of the redetection of temperature. By performing temperature detection in this manner at predetermined time intervals, the temperature of the radio receiver is monitored so that tracking error due to temperature changes can be reduced.

Figure 6:
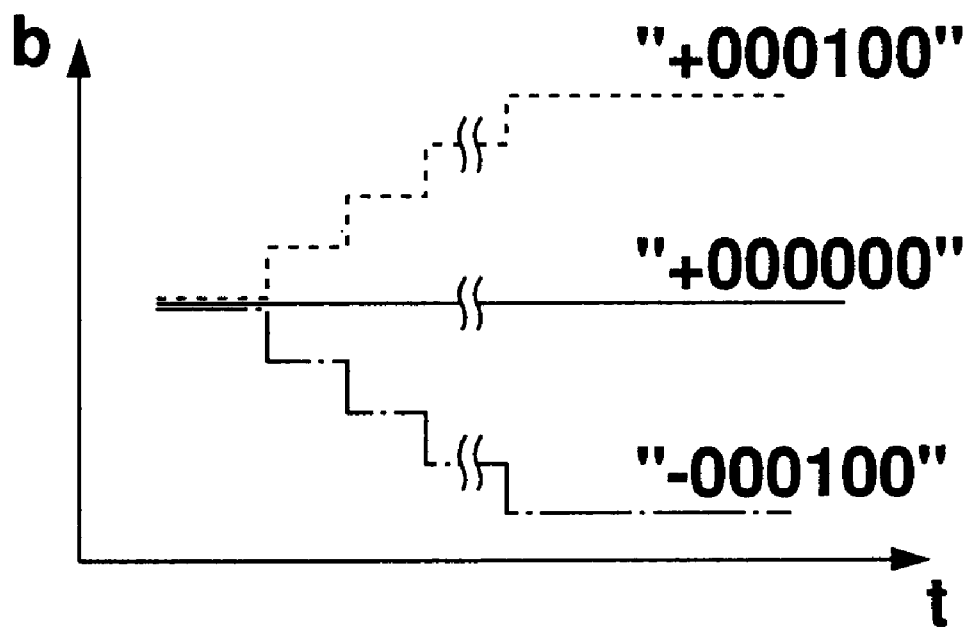
FIG. 6 illustrates an example of fine tuning the tuning correction signal "b" of the present invention.

If the tuning correction signal "b" is gradually changed so as to increase or decrease in the manner shown in FIG. 6 from start to end of fine adjustment when fine adjusting the tuning correction signal "b", any uneven audio levels can be suppressed. Namely, fine adjustment improves reception and the detection signal level gradually improves even as the detection state of the FM detector 6 improves. Thus, a sudden level change in detection level does not occur and uneven audio levels can be suppressed.

Figure 5:
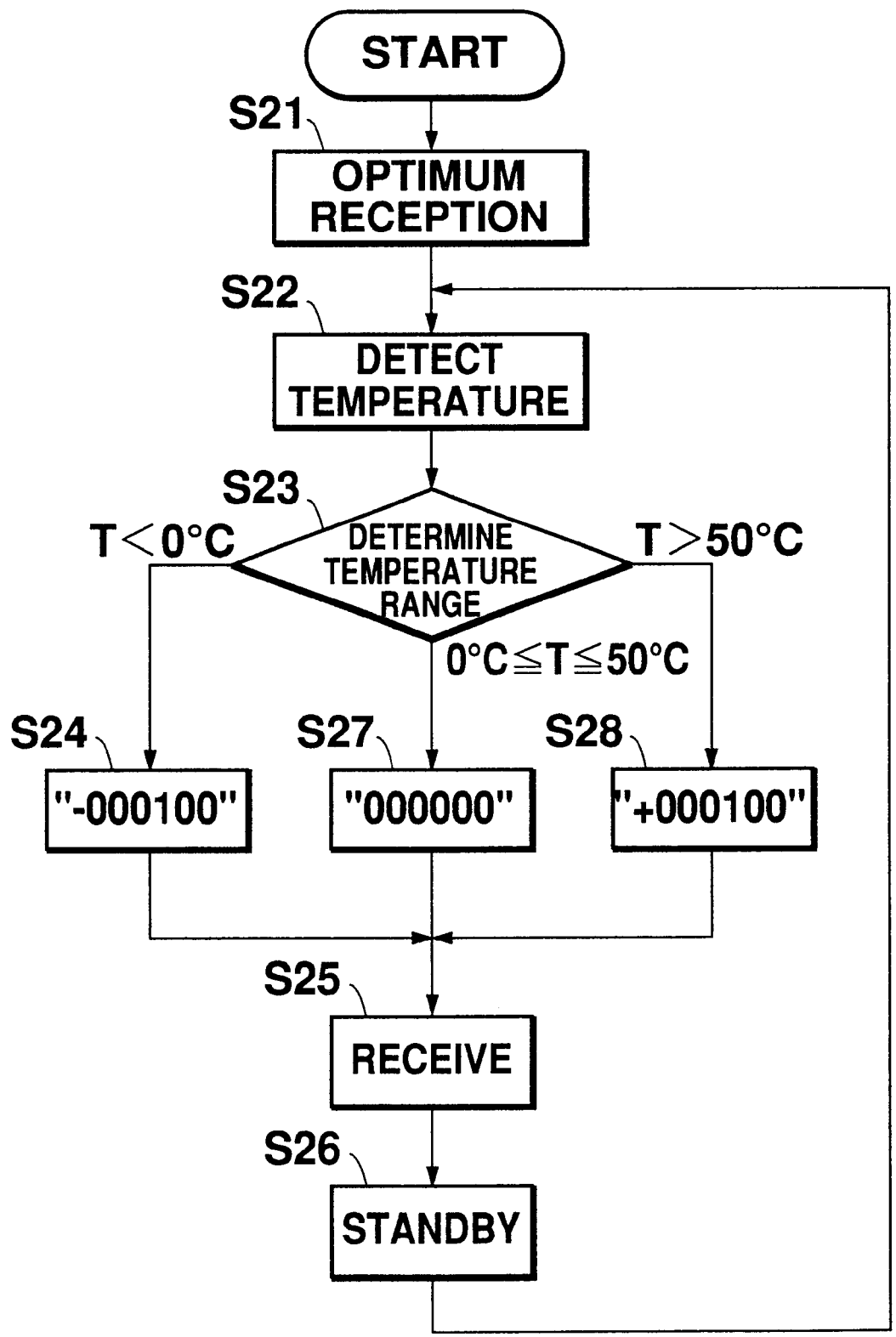
FIG. 5 is a flowchart showing a circuit operation for FIG. 4.

In the flowchart of FIG. 5, the three regions of below 0° C., 0° C. to 50° C., and greater than 50° C. were used to classify the temperature T. However, two or four or more regions may also be used to classify the temperature T. For example, five regions of below 0° C., 0° C. to 15° C., 15° C. to 30° C., 30° C. to 45° C., and above 45° C. may also be set to classify temperature T. As a result of this classification, data "–001000", "–000010", "000000", "+000010", or "+001000" for the five regions is added to the tuning correction signal "b" in the digital state so as to fine adjust the tuning correction signal "b". Changing the data to be added for fine adjustment for the different regions results in a large amount of fine adjustment when the deviation of the tuning frequency of the RF tuning circuit 2 due to the temperature characteristics of coil L and diode 2a is large, and a small amount of fine adjustment when the deviation is small. Thus, regardless of temperature changes, the tuning frequency can be made to approach the received frequency of the desired station. By subdividing the classifying regions and changing the amount of fine adjustment for each region in this manner, the deviation of the tuning frequency of the RF tuning circuit 2 according to the temperature characteristics of coil L and diode 2 can be fine adjusted at high accuracy.

Although the above-mentioned circuit was described for an FM receiver, a deviation of the tuning frequency of an RF tuning circuit due to temperature changes can be fine adjusted even if the present invention is employed in an AM receiver.

According to the present invention, by fine adjusting the correction signal in accordance with the radio receiver's temperature that is detected by the temperature detecting means and fine adjusting the tuning frequency of the RF tuning circuit, the tuning frequency, which has deviated from the received frequency of the desired station due to temperature changes, can be made to match the received frequency of the desired station, thereby reducing tracking error due to temperature changes in the radio receiver.

Furthermore, since the tuning frequency is gradually changed when fine adjusting the tuning frequency, sudden changes the IF signal level can be prevented even as reception improves from fine adjustment so that uneven audio levels can be reduced.

Furthermore, since the classification regions for the detected temperature are set narrow and the amount of fine adjustment for each region is changed, the tuning frequency of the RF tuning circuit can be fine adjusted at high accuracy.

While there has been described what is at present considered to be the preferred embodiment of the invention, it will be understood that various modifications may be made thereto, and it is intended that the appended claims cover all such modifications as fall within the true spirit and scope of the invention.

What is claimed is:

1. In a radio receiver including an RF tuning circuit for tuning an RF signal, a local oscillation circuit for outputting a local oscillation signal, a mixer for converting frequency of an output signal from said RF tuning circuit into an IF signal, using the local oscillation signal, and a correction circuit for generating a correction signal to correct a tuning frequency of said RF tuning circuit so as to match a frequency of a desired station, the radio receiver comprising:

temperature detecting means for detecting a temperature of said radio receiver; and adjusting means for fine adjusting said correction signal in accordance with said temperature.

2. A radio receiver according to claim 1 wherein said adjusting means slows the fine adjustment speed when fine adjusting said correction signal.

3. A radio receiver according to claim 1 wherein said adjusting means determines which of a plurality of regions contains the detected temperature, and fine adjusts said correction signal by an adjustment amount that was set for the determined region.

4. A radio receiver according to claim 1 further comprising:

a memory for storing a digital value of an adjustment amount for each of a plurality of temperature ranges that were set; and wherein said correcting means comprises correction signal generating means for generating a digital signal to form the basis of the original correction signal;

said adjusting means comprises judgment means for judging said temperature range to which the temperature detected by said temperature detection circuit belongs, and correction signal adjusting means for obtaining from said memory said adjustment amount which corresponds to the relevant temperature range, changing a value of said correction signal by the relevant adjustment amount, and calculating a value of the fine-adjusted correction signal.

5. A radio receiver according to claim 4 wherein said correction signal adjusting means realizes a stepwise change in said adjustment amount for said correction signal.

6. In a radio receiver including an RF tuning circuit for tuning an RF signal, a local oscillation circuit for outputting a local oscillation signal, a mixer for converting frequency of an output signal from said RF tuning circuit into an IF signal, using the local oscillation signal, and a correction circuit for generating a correction signal to correct a tuning frequency of said RF tuning circuit so as to match a frequency of a desired station, the radio receiver comprising:

temperature detecting means for detecting a temperature of said radio receiver; and adjusting means for fine adjusting said correction signal in accordance with said temperature, wherein said adjusting means is set with a first reference temperature and a second reference temperature, which is higher than said first reference temperature, as temperatures that become references of an operation thereof;

said correction signal is fine adjusted by only a first predetermined amount when the detected temperature is lower than said first reference temperature;

said correction signal is fine adjusted only by a second predetermined amount when the detected temperature is greater than said second reference temperature; and said correction signal is not fine adjusted when the detected temperature is greater than or equal to said first reference temperature and less than or equal to the second reference temperature.

7. A radio receiver according to claim 6 wherein said adjusting means slows the fine adjustment speed when fine adjusting said correction signal.

8. A radio receiver according to claim 6 wherein said adjusting means is set with three or more reference temperatures including said first and second reference temperatures as temperatures that become references for an operation thereof, and said adjusting means determines which of a plurality of regions divided by said reference temperatures contains the detected temperature and fine adjusts said correction signal by an adjustment amount that was set in accordance with the determined region.

9. A radio receiver according to claim 6 further comprising:

a memory for storing a digital value of an adjustment amount for each of a plurality of temperature ranges that were set; and wherein said correcting means comprises correction signal generating means for generating a digital signal to form the basis of the original correction signal; and said adjusting means comprises judgment means for judging said temperature range to which the temperature detected by said temperature detection circuit belongs, and correction signal adjusting means for obtaining from said memory said adjustment amount which corresponds to the relevant temperature range, changing a value of said correction signal by the relevant adjustment amount, and calculating a value of the fine-adjusted correction signal.

10. A method for adjusting a tuning frequency to be used in a radio receiver comprising an RF tuning circuit for tuning an RF signal, a local oscillation circuit for outputting a local oscillation signal, a mixer for converting frequency of an output signal from said RF tuning circuit into an IF signal, using the local oscillation signal, and a correction circuit for generating a correction signal to correct a tuning frequency of said RF tuning circuit so as to match a frequency of a desired station, said method comprising the steps of:

detecting a temperature of said radio receiver; and fine adjusting said correction signal in accordance with said temperature.

11. A method for adjusting a tuning frequency to be used in a radio receiver comprising an RF tuning circuit for tuning an RF signal, a local oscillation circuit for outputting a local oscillation signal, a mixer for converting frequency of an output signal from said RF tuning circuit into an IF signal, using the local oscillation signal, and a correction circuit for generating a correction signal to correct a tuning frequency of said RF tuning circuit so as to match a frequency of a desired station, said method comprising the steps of:

detecting a temperature of said radio receiver by using said temperature detecting means;

fine adjusting said correction signal by only a first predetermined amount when said detected temperature is lower than a first reference temperature; and fine adjusting said correction signal by only a second predetermined amount when said detected temperature is greater than a second reference temperature, which is higher than said first reference temperature.

12. A radio receiver according to claim 11, wherein said correction signal adjusting means achieves a stepwise change in said adjustment amount for said correction signal.

* * * * *